June 19, 1962 R. E. HUKEE 3,040,272

FREQUENCY CONTROL CIRCUIT FOR A CRYSTAL OSCILLATOR

Filed Sept. 16, 1957

INVENTOR.
RUSSELL E. HUKEE
BY John A Duffy
AGENT

United States Patent Office 3,040,272
Patented June 19, 1962

3,040,272
FREQUENCY CONTROL CIRCUIT FOR A CRYSTAL OSCILLATOR

Russell E. Hukee, Santa Ana, Calif., assignor to North American Aviation, Inc.

Filed Sept. 16, 1957, Ser. No. 684,367
5 Claims. (Cl. 331—154)

Figure 1:
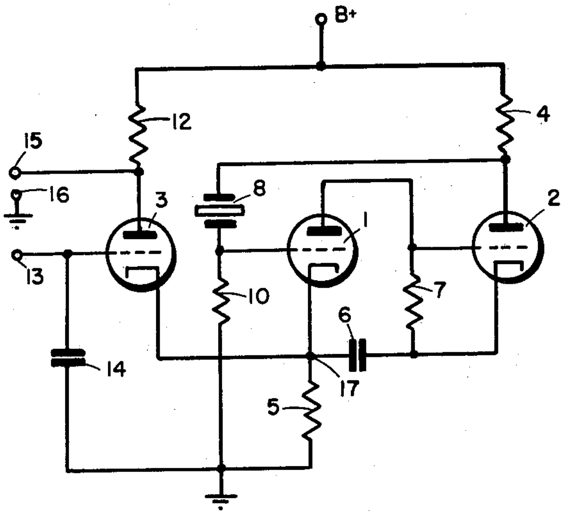

This invention relates to a frequency control circuit and more particularly to a frequency modulated crystal oscillator.

The use of the crystal oscillators to produce alternating-current signals of stable frequency is well-known. Such a circuit is shown, for example, in the Campbell Patent No. 2,656,467. The crystal oscillator of Campbell produces an alternating current signal of stable frequency determined by a piezoelectric crystal in the internal circuitry of the oscillator. The characteristics of the frequency determining crystal are such that an exact frequency output conforming to the frequency characteristics of the crystal can be obtained from the oscillator. While the crystal oscillator of stable frequency offers many advantages, one disadvantage is that it cannot be controlled in frequency because the crystal is tuned to one frequency only. Today in the electronic art there is a particular need for a crystal oscillator which produces a stable predetermined output frequency which can be further controlled in frequency within prescribed limits.

Frequency control of crystal oscillators in the past has met with many difficulties. One method developed makes use of a system of phase modulation but before applying the modulating voltage to the system transmits the modulating voltage through a network which produces an output inversely proportional to frequency. A disadvantage of this system is that the modulation index that can be directly obtained while still maintaining linearity of modulation is small so that a number of stages of generation must be used if a large modulation index is to be obtained. In other words, very little frequency control may be obtained while still maintaining a highly stable output frequency. A second common system of frequency control or modulation utilizes a modulating voltage to control the frequency of the generated oscillations. This system has the disadvantage that the mean frequency of the oscillator cannot be stabilized accurately without the use of relatively complicated automatic frequency control systems.

This invention contemplates a frequency control circuit in which a crystal oscillator of highly stable frequency output is frequency modulated by an input modulating voltage which may be, for example, a direct current to control the frequency output of the oscillator within prescribed limits. Circuitry is provided which modulates the frequency output of the crystal within the aforesaid prescribed limits without affecting the stable and accurate frequency output of the oscillator. The device of this invention overcomes the above-noted disadvantages by providing a control of the frequency of the crystal oscillator which is external to the oscillator and does not affect the internal stable frequency characteristics of the oscillator.

It is therefore an object of this invention to provide a frequency controlled crystal oscillator.

It is another object of this invention to provide a frequency modulated crystal oscillator.

It is still another object of this invention to provide a means for frequency modulating the output of a crystal oscillator while still maintaining the stability of said oscillator.

It is a further object of this invention to provide a frequency modulated crystal oscillator whose output frequency is determined by the characteristics of the crystal and the modulating input signal.

Figure 2:
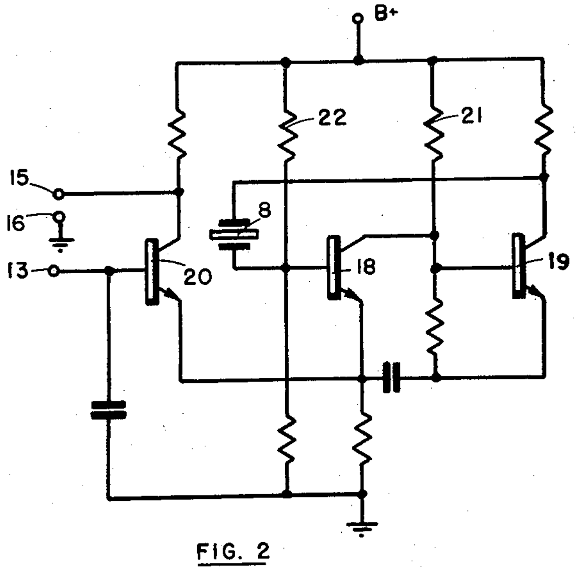

Other objects of the invention will become apparent from the following description taken in connection with the drawings in which FIG. 1 represents a schematic diagram of the device of one embodiment of this invention, utilizing vacuum tubes; and FIG. 2 represents another embodiment of this invention, utilizing transistors.

Referring to FIG. 1, there is shown a crystal oscillator comprising triodes 1 and 2 which are intercoupled by crystal 8 and other associated circuitry to form a relaxation oscillator with a frequency determined by the natural frequency of crystal 8. Triode 2 receives an operating potential supply from a direct-current supply source and is connected through resistor 4 to the B+ terminal of a direct-current source. Triode 2 is connected directly by its grid to the plate of triode 1, the cathode of which is connected to ground by resistance 5. Capacitor 6 connects the cathodes of the triodes 1 and 2 and resistance 7 biases the grid of triode 2 from its cathode. Piezoelectric crystal 8 connects the grid of triode 1 with the plate of triode 2 and resistance 10 biases the grid of triode 1.

In operation, the circuit described thus far functions as a relaxation oscillator in which one triode is conducting and the other triode is cut off. Assuming, for example, triode 2 has been conducting and now triode 1 commences conducting. Capacitor 6 is charged as shown in FIG. 1. The plate of conducting triode 1 drops to a relatively negative potential and being directly connected to the grid of triode 2, cuts off triode 2. As triode 1 conducts, capacitor 6 discharges thereby decreasing the positive bias potential on the cathode of triode 2 created by charged capacitor 6. Eventually the cathode to grid potential of triode 2 falls negatively thereby allowing the flow of current from the plate to cathode of triode 2. As triode 2 commences to conduct the potential at its plate drops and this potential drop coupled through crystal 8 to the grid triode 1 causes triode 1 to cut off. Triode 2 remains conducting and triode 1 remains cut off until capacitor 6 is again charged to a point where the charging of capacitor 6 causes the potential of the cathode of triode 1 to drop relatively to the grid thereby causing conduction again in triode 1 and the cycle repeats. Thus it is that the charging and discharging of capacitor 6 causes conduction and non-conduction in triodes 1 and 2 thereby forming a relaxation oscillator. Under normal operation, the frequency of the relaxation oscillator is controlled by crystal 8 which is tuned to a predetermined frequency and presents a high impedance to any other frequency obtaining a high degree of frequency stability in the oscillator.

In order to provide a control of the frequency of the relaxation oscillator and still provide a stable frequency output, a circuit is provided which frequency modulates the output of the relaxation oscillator without affecting the stability of the oscillator. In FIG. 1, amplifying device 3 which is shown as a vacuum tube is supplied with operating potentials by having its plate connected through resistor 12 to the B+ supply, and its cathode connected in common with the cathode of triode 1 through resistor 5 to ground. Direct-current control of triode 3 is provided by having its grid being connected to receive a modulating direct current, or other bias signal from input terminal 13. Capacitor 14 is connected from the grid of triode 3 to ground to provide a ground for high frequency oscillations. Capacitor 14 bypasses the crystal frequency signal from the crystal oscillator but does not affect the input modulating signal from terminal 13. Output terminals 15 and 16 are connected to the plate of triode 3 to present the frequency modulated output of this circuit.

In operation, taking the circuitry of amplifier 3 in conjunction with the oscillator of triodes 1 and 2, initially point 17 in the common cathode circuit of triodes 1 and 3, is producing an alternating-current signal at a frequency determined by crystal 8. Upon receipt of an input signal at the grid of triode 3, triode 3 conducts causing an increase in current flowing from the plate to the cathode through resistor 5 to ground. An increase in current through resistor 5 causes the potential in the common cathode circuit at the point 17 to rise. This rise in potential at the point 17 changes the bias relationship between the cathode and grid potential of triode 1 in such a way as to decrease the gain of triode 1 operating at the crystal frequency of crystal 8. The decrease in gain of triode 1 causes the frequency at the output of triodes 1 and 2 to increase, by decreasing the effective voltage which capacitor 6 must charge to in order to reverse the conduction states of triodes 1 and 2. The stability of the oscillator circuit is still relatively unaffected being basically determined by crystal 8. Thus far in the circuitry described, it can be seen that with an increasing input signal from terminal 13 to the grid of triode 3, point 17 is caused to raise in potential thereby raising the relative potential between the cathode and grid of triode 1, thus decreasing the gain of triode 1. A decrease in gain further causes the frequency of the oscillator of triodes 1 and 2 to increase slightly, still mainly determined by crystal 8. It is significant to note that the frequency of the operation of triodes 1 and 2 is being controlled by changing the potential at point 17 in the cathode circuit of triode 1.

The alternating-current signal of increased frequency from the crystal oscillator at point 17 described above is also presented to the cathode of triode 3 since the cathode of triode 3 and triode 1 are connected in common. Therefore, the voltage on the cathode of triode 3 is a voltage at the frequency of the crystal oscillator determined by crystal 8 which has been frequency modulated by a direct-current bias signal into the gride of triode 3. Capacitor 14 being large enough to pass the frequency of the oscillating signal at the cathode of the triode 3 and small enough not to affect the modulating input direct-current signal at the grid of triode 3, allows triode 3 to operate as a grounded grid amplifier for the alternating-current signal of crystal frequency at its cathode. The modulated alternating-current signal at the cathode of triode 3 is therefore amplified by triode 3 and the alternating-current output signal is taken at terminals 15 and 16 which are connected to the plate of triode 3. Operation of the circuitry described will be similar if the frequency of the oscillator of triodes 1 and 2 is to be reduced by lowering the input modulating signal at the grid of the triode 3. A decrease in the signal at the grid of triode 3 will cause a corresponding decrease in the potential at point 17 and a decrease in frequency of the oscillator of triodes 1 and 2 which is reflected back through the cathode of triode 3 into the output terminals 15 and 16 connected to the plate thereof.

One of the important aspects of the circuit described is the decoupling between the modulating signal at terminal 13 and the relaxation oscillator circuit of triodes 1 and 2. Decoupling is accomplished by reason of the fact that triode 3 is acting as a modulating amplifier when the modulating direct-current input is presented from terminal 13 and thereby controls the oscillator of triodes 1 and 2 by controlling the potential at point 17. On the other hand, when the frequency of the oscillator of triodes 1 and 2 is changed at point 17, it is reflected back through the cathode of triode 3 which now is acting as a grounded grid amplifier to the signal presented from point 17 to the cathode of triode 3. Operation in this manner insures that the inherent stable frequency of the oscillator of triodes 1 and 2 remains unaffected by the direct-current modulating signal presented from terminal 13. It is this characteristic of the circuit which provides for the stable frequency characteristics required.

FIG. 2 shows another embodiment of the device of this invention which operates in the same manner as the embodiment shown in FIG. 1, but utilizes semi-conductor transistors 18 and 19, comprising the relaxation oscillator and semi-conductor transistor 20 as the input modulating terminal. Transistors 18, 19 and 20 are n-p-n transistors which have their collectors connected through similar resistors to a B+ supply and their emitters connected through resistors similar to those of FIG. 1 to ground. Operation of FIG. 2 is the same as that of FIG. 1 allowing for the inherent differences between transistors and vacuum tubes which do not affect the basic operation of the circuit. In FIG. 2, a bias is provided for the base of transistor 19 by resistor 21 which connects the base to the B+ supply. Likewise resistor 22 connects the base of transistor 18 to the B+ supply to provide base current thereof.

The device of this invention provides a control of the predetermined oscillator frequency determined by crystal 3 in such manner that a frequency range within prescribed limits may be maintained at point 17 of the oscillator circuit of FIG. 1. A comparative wide range of controlled frequencies may be obtained by the above circuitry, due primarily to the decoupling operation between the input modulating signal presented by terminal 13 and the output modulated signal across terminals 15 and 16. In this manner a wider range of frequencies from the frequency of crystal 8 may be obtained. An important advantage to this is the lack of the necessity for frequency multipliers or other complicated control circuits to increase the range of frequencies available from the crystal oscillator.

A particular application of the circuits of FIGS. 1 and 2 will occur in a system where a pair of relaxation oscillators similar to that shown in FIG. 1, is provided wherein one oscillator is oscillating at a given predetermined frequency and the other oscillator is oscillating at a different predetermined frequency. In this application it is necessary to maintain the ratio of the predetermined frequencies of the oscillators at a constant, accurate figure. In other words, one oscillator is slaved to the other oscillator in frequency. The circuit of FIG. 1 will accomplish this in a simple manner by providing an output direct current signal at terminal 13 proportional to the frequency of the master oscillator. In this manner oscillator No. 2 is slaved to oscillator No. 1 and any change or drift in frequency in one oscillator will result in a corresponding change or drift in frequency of the other oscillator. Other applications of the circuitry of FIGS. 1 and 2 will occur in any situation where there is required an automatic frequency or phase control circuit or a frequency modulated transmitter.

Although the invention has been described and illustrated in detail, it is to be clearly understood that the same is by way of illustration and example only and is not to be taken by way of limitation, the spirit and scope of this invention being limited only by the terms of the appended claims.

I claim:

1. In a crystal oscillator wherein first and second electronic valves are interconnected with the anode electrode of each coupled to the control electrode of the other to form a multivibrator, and wherein the cathode electrodes are coupled together through a capacitor, improved means for modulating the frequency of said oscillator while maintaining a stable system comprising: a third electronic valve having anode, control, and cathode electrodes; a direct current connection between the cathode of said third valve and the cathode of said first valve; a direct current impedance having one end connected to the junction of the cathodes of said first and third valves; means for impressing a modulation control signal upon the control electrode of said third valve and means for impressing operating potentials across the anode electrodes of said second and third valves and the other end of said direct current impedance.

2. A crystal oscillator comprising: first and second electronic valves intercoupled with the anode electrode of each valve coupled to the control electrode of the other valve to form a free-running multivibrator, and means coupling the cathodes of said valves together to form a common junction; a third electronic valve having anode, control, and cathode electrodes; a direct current connection between the cathode of said third valve and said common junction; means for impressing a modulating input signal upon the control electrode of said third valve; means for deriving a frequency modulated output signal from the anode of said third valve; and a direct current impedance coupled to said common junction to permit establishment at the cathodes of said first and second valves of a signal causing frequency variation in said crystal oscillator in accordance with said modulating input signal.

3. Improved means for modulating the frequency of a crystal oscillator wherein first and second electronic valves are interconnected with the anode electrode of each connected to the control electrode of the other, and the cathode electrodes are coupled together through an alternating current impedance, said improved means comprising a third electronic valve having anode, control, and cathode electrodes; a direct-current impedance coupled to the cathode of said first electronic valve; a direct current connection between the cathode of said third valve and the cathode of said first valve; and means for impressing a frequency modulation control signal upon the control electrode of said third valve and for deriving a frequency modulated output signal from the anode electrode of said third valve.

4. In a crystal oscillator system having first and second electronic valves interconnected with the anode of each coupled to the control electrode of the other and the cathodes coupled together to form a common junction, means for modulating the frequency of said oscillator without disturbing the stability thereof comprising: a third electronic valve having anode, control, and cathode electrodes, the cathode of said third valve being coupled to a direct current impedance to generate a control signal in response to a modulation input signal applied to the control electrode of said third valve; means for applying said control signal to said common junction to cause variation in the frequency of said oscillator in accordance with the value of the modulation input signal applied to the control electrode of said third valve.

5. In a crystal oscillator system of stable yet variable frequency where the oscillator includes first and second amplifiers each having first, second, and third electrodes, the first electrode of each amplifier being coupled to the second electrode of the other amplifier and the third electrodes of said amplifiers being coupled together to form a common junction, an improved means for controlling the frequency of said oscillator without disturbing the stability thereof, said improved means comprising: a third amplifier having first, second and third electrodes, the second electrode of said third amplifier receiving a modulation control signal for developing a direct current signal at the third electrode thereof; means for applying said modulation control signal developed in the third electrode of said third amplifier to said common junction; and means coupled to said common junction for developing a frequency control signal for modifying the frequency of said oscillator in accordance with said modulation input signal applied to the second electrode of said third amplifier.

References Cited in the file of this patent

UNITED STATES PATENTS

| | | |
|---|---|---|
| 2,392,114 | Bartelink | Jan. 1, 1946 |
| 2,438,950 | Smith | Apr. 6, 1948 |
| 2,510,868 | Day | June 6, 1950 |
| 2,610,318 | Clark | Sept. 9, 1952 |
| 2,656,467 | Campbell | Oct. 20, 1953 |
| 2,666,852 | Hollingsworth | Jan. 19, 1954 |
| 2,683,252 | Gordon | July 6, 1954 |
| 2,750,502 | Gray | June 12, 1956 |
| 2,756,335 | Snyder | July 24, 1956 |